United States Patent

Koga

[11] Patent Number: 5,905,390
[45] Date of Patent: May 18, 1999

[54] INDUCTIVE LOAD DRIVE CIRCUIT

[75] Inventor: Toru Koga, Kyoto, Japan

[73] Assignee: Rohm, Co., Ltd., Kyoto, Japan

[21] Appl. No.: 08/936,261

[22] Filed: Sep. 24, 1997

[30] Foreign Application Priority Data

Sep. 24, 1996 [JP] Japan .................................. 8-251888

[51] Int. Cl.[6] .................................................. H03B 1/00
[52] U.S. Cl. ........................ 327/110; 327/365; 327/419
[58] Field of Search ................................ 327/108, 109, 327/110, 111, 112, 365, 379, 383, 419, 423, 478

[56] References Cited

U.S. PATENT DOCUMENTS

4,962,346  10/1990  Maggioni et al. ...................... 307/270
5,631,588   5/1997  Bertolini ................................ 327/108

Primary Examiner—Timothy P. Callahan
Assistant Examiner—Jeffrey Zweizig
Attorney, Agent, or Firm—Hoffmann & Baron, LLP

[57] ABSTRACT

An inductive load drive circuit includes a transistor for pulling-in an excitation current having a predetermined polarity and generated by an inductive load. The transistor is turned-on by a first idling loop when a drive voltage of the inductive load has a negative polarity, and the transistor is turned-on by a second idling loop when the drive voltage has a positive polarity. Though both of the first idling loop and the second idling operate on the basis of the drive voltage, in pulling the excitation current into the circuit, the drive voltage reaches a lower limit of a dynamic range at a time that the first idling loop is suitably operated while the drive voltage reaches an upper limit of the dynamic range at a time that the second idling loop is suitably operated.

7 Claims, 6 Drawing Sheets

1
INDUCTIVE LOAD DRIVE CIRCUIT

BACKGROUND OF THE INVENTION

1. Field of the Invention

The present invention relates to an inductive load drive circuit. More specifically, the present invention relates to an inductive load drive circuit which is applied to a disc drive for a disc such as CD (Compact Disc), CD-ROM, MD (Mini Disc) and etc., and controls a current flowing an inductive load included in a pickup feeding motor, a spindle motor, a loading motor, a lens actuator and etc.

2. Description of the Prior Art

Figure 4:
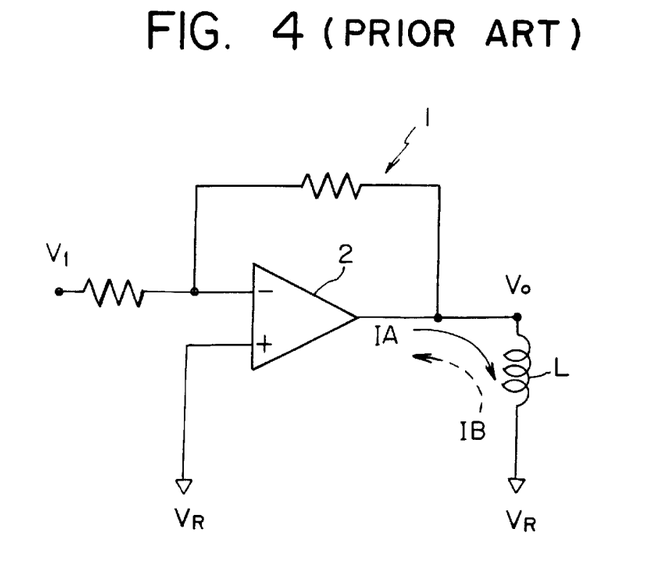
FIG. 4 is a circuit diagram showing a prior art.
Figure 5:
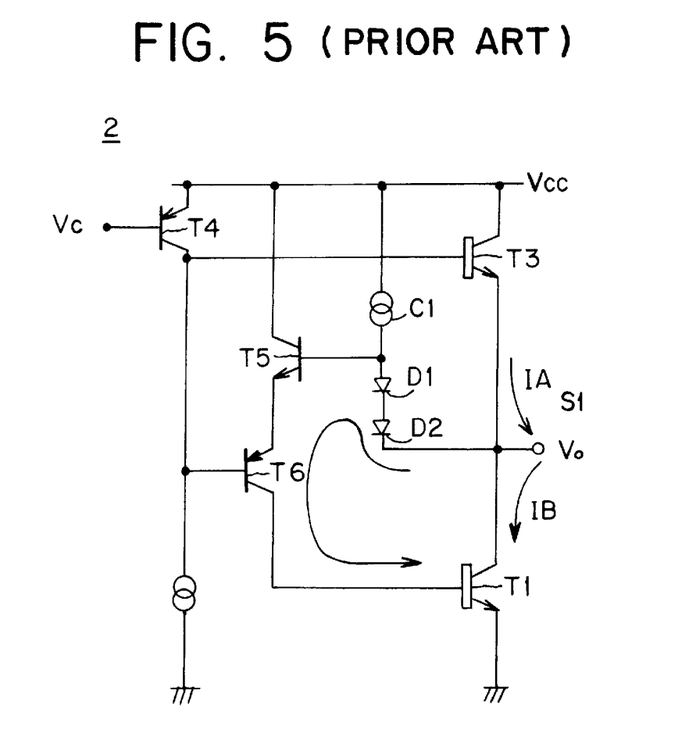
FIG. 5 is a circuit diagram showing a portion of the prior art shown in FIG. 4.

One example of conventional such a kind of inductive load drive circuit is shown in FIG. 4 and FIG. 5. In a case where the inductive load drive circuit shown in FIG. 4 is provided in the lens actuator of an optical pickup, excitation currents $I_A$ and $I_B$ flowing an inductive load L are switched in response to an input voltage $V_i$ based on a tracking control signal or a focus control signal. That is, the input voltage $V_i$ is amplified by a negative feedback amplifier 1 including an operational amplifier 2, whereby a drive voltage $V_O$ of the inductive load L is obtained. The excitation currents $I_A$ and $I_B$ having phases each delayed 90 degrees from the drive voltage $V_O$ flow through the inductive load L.

Figure 6:
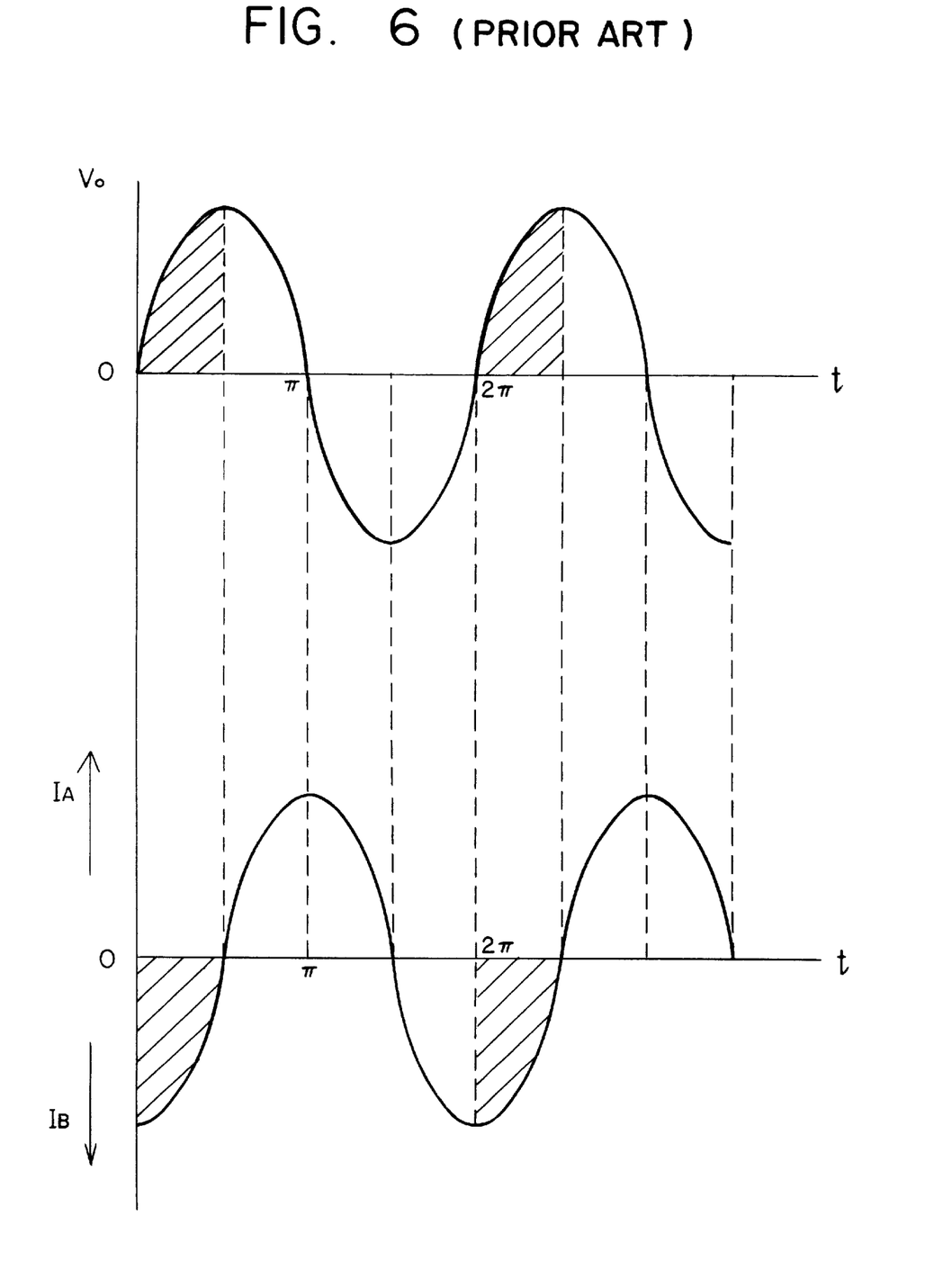
FIGS. 6, 6A and 6B are waveform charts showing portions of the prior art shown in FIG. 4.
Figure 6A:
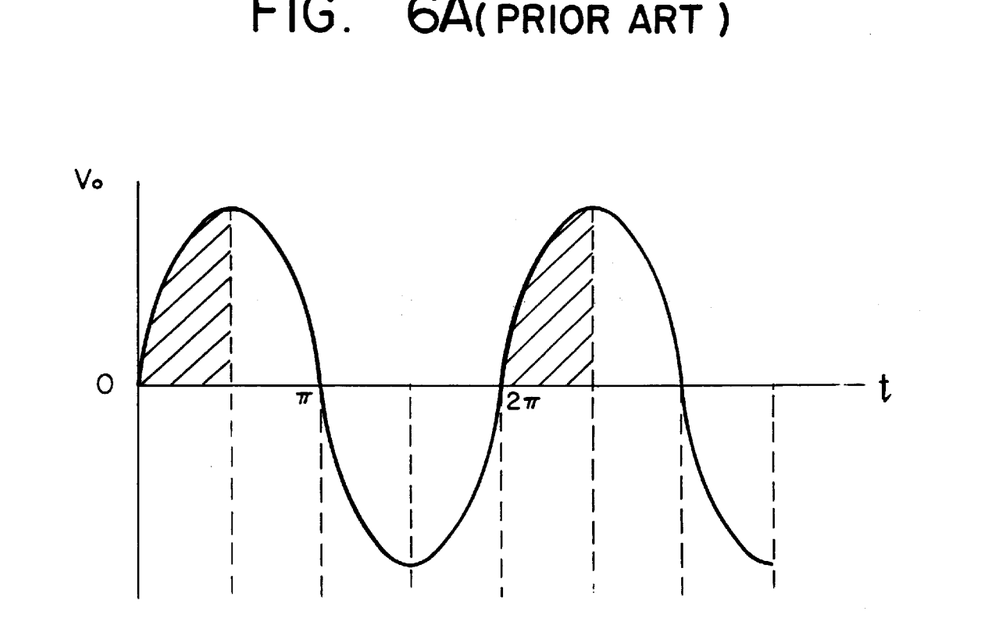
Figure 6B:
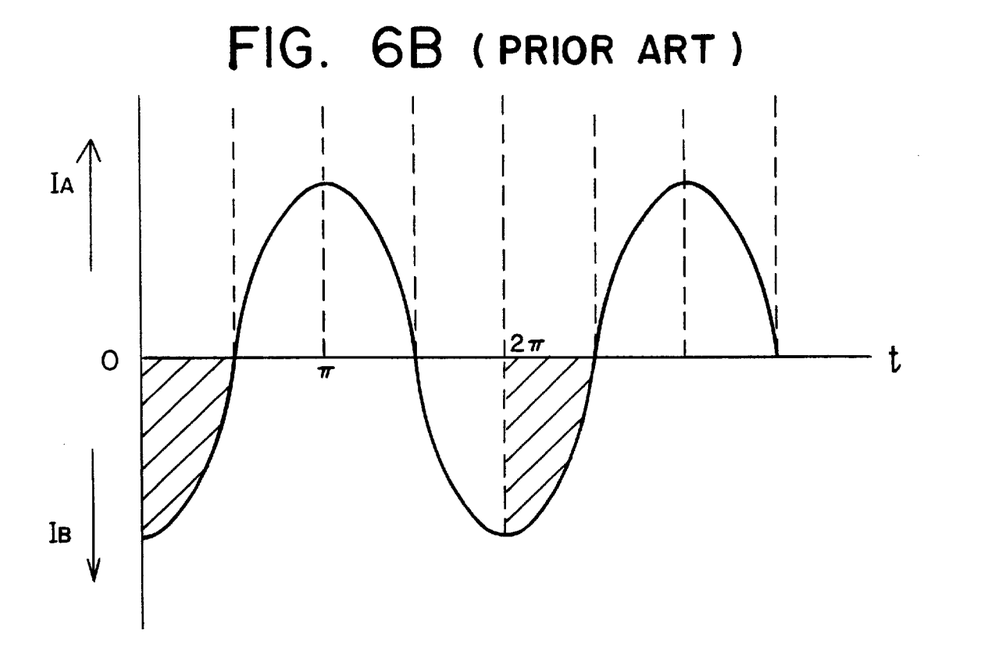

An output stage of the operational amplifier 2 is constituted as shown in FIG. 5. The drive voltage $V_O$ is outputted from an output terminal S1 in response to a control voltage $V_c$ applied to a base of a transistor T4. As shown in FIGS. 6A and 6B, the phases of the excitation currents $I_A$ and $I_B$ flowing through the inductive load L are respectively delayed 90 degrees from the drive voltage $V_O$. In FIG. 6A, a positive excitation current $I_A$ flows into the inductive load L, and a negative excitation current $I_B$ flows from the inductive load L.

Furthermore, a push-pull circuit is constituted by transistors T3 and T1. Accordingly, when the excitation current $I_A$ flows into the inductive load L, the transistor T3 is turned-on and the transistor T1 is turned-off. On the other hand, when the excitation current $I_B$ flows from the inductive load L, the transistor T3 is turned-off and the transistor T1 is turned-on.

When the excitation current $I_A$ flows, a collector voltage of a transistor T4 becomes slightly higher than the drive voltage $V_O$, whereby the transistor T3 is turned-on. In contrast, when the excitation current $I_B$ flows, the collector voltage of the transistor T4 becomes equal to the drive voltage $V_O$, whereby the transistor T1 is turned-on by an idling loop composed of a constant-current source C1, diodes D1 and D2, and transistors T5 and T6. That is, the diodes D1 and D2 are inserted between the output terminal S1 and a base of the transistor T5, and forward drop voltages of the diodes D1 and D2 and base-emitter voltages between bases and emitters of the transistors T5 and T6 are equal to each other, respectively. Though the transistors T5 and T6 are not turned-on if the collector voltage of the transistor T4 is larger than the drive voltage $V_O$, the transistors T5 and T6 are turned-on if the collector voltage of transistor T4 becomes equal to the drive voltage $V_O$, whereby the transistor T1 becomes a conductive state, and the excitation current $I_B$ flows from the inductive load L.

In such a prior art, since the constant-current source C1 and the diodes D1 and D2 are inserted between a power source $V_{CC}$ and the output terminal S1, an upper limit of the drive voltage $V_O$ that the idling loop is operated is "$V_{CC} - V_{SAT(C1)} - 2V_F$" ($V_{SAT(C1)}$: a saturation voltage of the constant-current source C1). On the other hand, when the excitation current $I_B$ flows, the transistor T3 is not turned-on, and thus, an upper limit of a dynamic range of the drive voltage $V_O$ is more than "$V_{CC}$". Accordingly, there is a possibility that the transistor T1 is not suitably controlled, and thus, a negative feedback operation becomes unstable. That is, since the phase of the current flowing through the inductive load L is delayed by 90 degrees from the drive voltage $V_O$, it is necessary to turn-on the transistor T1 such that the current $I_B$ can flow during a period shown by oblique lines in FIGS. 6A and 6B. Accordingly, if the drive voltage $V_O$ is too large, the transistor T1 is not suitably turned-on, and therefore, the negative feedback operation becomes unstable.

SUMMARY OF THE INVENTION

Therefore, a principal object of the present invention is to provide a novel inductive load drive circuit.

Another object of the present invention is to provide an inductive load drive circuit capable of stabilizing a negative feedback operation.

According to the present invention, an inductive load drive circuit which supplies a drive voltage having a dynamic range to an inductive load comprises: a pulling-in means for pulling-in an excitation current having a predetermined polarity and generated at the inductive load; a first control means for controlling the pulling-in means on the basis of the drive voltage being changed within a first range which is narrower than the dynamic range and whose lower limit is coincident with a lower limit of the dynamic range; a second control means for controlling the pulling-in means on the basis of the drive voltage being changed within a second range which is narrower than the dynamic range and whose upper limit is coincident with an upper limit of the dynamic range; and an enabling means for selectively enabling the first control means and the second control means according to a change of the drive voltage.

An AC drive voltage that is changed within a first range is supplied to the inductive load. The excitation current having a phase delayed by 90 degrees from the drive voltage is generated at the inductive load, and the excitation current being a negative polarity is pulled into the circuit by the pulling-in means, i.e. a first transistor. The first transistor is turned-on by the first control means during a time that the drive voltage has the negative polarity, for example, and the first transistor is turned-on by the second control means during a time that the drive voltage has a positive polarity, for example. The first control means and the second control means have ranges of the drive voltages capable of controlling the first transistor, which are different from each other. More specifically, when a level of the drive voltage is changed, there occurs a case where the second control means is unable to turn-on the first transistor while the first control means is able to turn-on the first transistor. In contrast, there is a case where the second control means is able to turn-on the first transistor while the first control means is unable to turn-on the first transistor. Accordingly, the first control means and the second control means are selectively enabled by the enabling means in accordance with the change of the drive voltage.

According to the present invention, since the first control means and the second control means are selectively enabled by the enabling means, it is possible to suitably control the pulling-in means, thereby to stabilize the negative feedback operation.

In an aspect of the present invention, a second transistor is connected to the first transistor in a Darlington manner, and a base current is inputted to a base of the second transistor by a current input means. A switching means is inserted between the base of the second transistor and the current input means.

The switching means is turned-on or -off by the enabling means. That is, the enabling means compares a first associated voltage associated with the drive voltage and a reference voltage with each other, and turns-on or -off the switching means in response to a comparison result.

In another embodiment of the present invention, a diode, for example, is inserted between a voltage point having a second associated voltage associated with the drive voltage and the base of the second transistor. A forward drop voltage of the diode is equal to a base-emitter voltage between the base and an emitter of the second transistor. When the drive voltage is equal to the second associated voltage, the second transistor is turned-on, and therefore, the first transistor is turned-on.

The above described objects and other objects, features, aspects and advantages of the present invention will become more apparent from the following detailed description of the present invention when taken in conjunction with the accompanying drawings.

DETAILED DESCRIPTION OF THE PREFERRED EMBODIMENT

Figure 1:
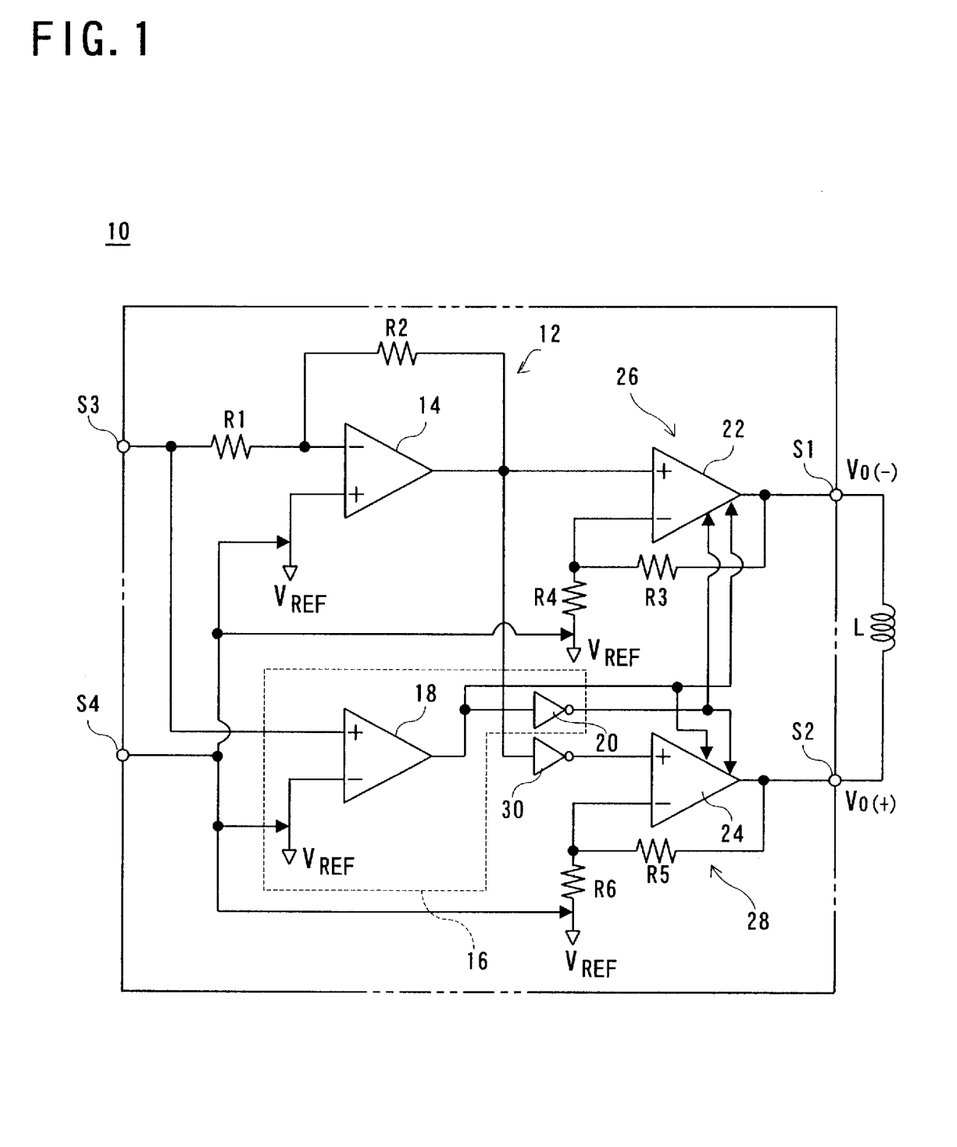
FIG. 1 is a circuit diagram showing one embodiment of the present invention.

An inductive load drive circuit 10 of this embodiment shown in FIG. 1 includes a terminal S3 for receiving an input voltage and a terminal S4 for receiving a reference voltage. The input terminal S3 is connected to a minus (−) or negative terminal of an operational amplifier 14 constituting a feedback amplifier 12 through a resistor R1. A feedback resistor R2 is inserted between an output terminal and the minus or negative terminal of the operational amplifier 14, and the input terminal S4 is connected to a plus (+) or positive terminal of the operational amplifier 14. Furthermore, the input terminals S3 and S4 are respectively connected to a plus (+) or positive terminal and a minus (−) or negative terminal of a comparator 18 included in a polarity comparator 16, and an output of the comparator 18 is directly and through an inverter 20 applied to operational amplifiers 22 and 24, respectively. Evenmore, the output terminal of the operational amplifier 14 is directly connected to a plus (+) or positive terminal of the operational amplifier 22 and connected to a plus (+) or positive terminal of the operational amplifier 24 through an inverter 30.

The operational amplifier 22 is included in a feedback amplifier 26, and the operational amplifier 24 is included in a feedback amplifier 28. In the feedback amplifier 26, a feedback resistor R3 is inserted between an output terminal and a minus (−) or negative terminal of the operational amplifier 22, and a resistor R4 is inserted between the negative terminal of the operating amplifier 22 and the terminal S4. Furthermore, in the feedback amplifier 28, a feedback resistor R5 is inserted between an output terminal and a minus (−) or negative terminal of the operational amplifier 24, and a resistor R6 is inserted between the negative terminal of the operating amplifier 24 and the terminal S4. A drive voltage $V_{O(-)}$ outputted from the feedback amplifier 26 is applied to one end of an inductive load L through a terminal S1, and a drive voltage $V_{O(+)}$ outputted from the feedback amplifier 28 is applied to another end of the inductive load L through a terminal S2.

The feedback amplifier 12 amplifies the input voltage from the terminal S3. An amplified voltage is directly applied to the positive terminal of the operational amplifier 22, and applied to the positive terminal of the operational amplifier 24 through the inverter 30. Since the feedback amplifiers 26 and 28 have the same circuit configuration, a polarity is inverted between the drive voltage $V_{O(-)}$ outputted from the operational amplifier 22 and the drive voltage $V_{O(+)}$ outputted from the operational amplifier 24. The inductive load L is driven by such the drive voltages $V_{O(-)}$ and $V_{O(+)}$.

On the other hand, the comparator 18 compares the input voltage from the terminal S3 and the reference voltage from the terminal S4 with each other, and the comparator 18 outputs a high level signal if the input voltage is equal to or larger than the reference voltage, and outputs a low level signal if the input voltage is smaller than the reference voltage. The output of the comparator 18 is directly applied to the operational amplifiers 22 and 24, and applied to the operational amplifiers 22 and 24 through the inverter 20, whereby characteristics of the operational amplifiers 22 and 24 can be changed.

Figure 2:
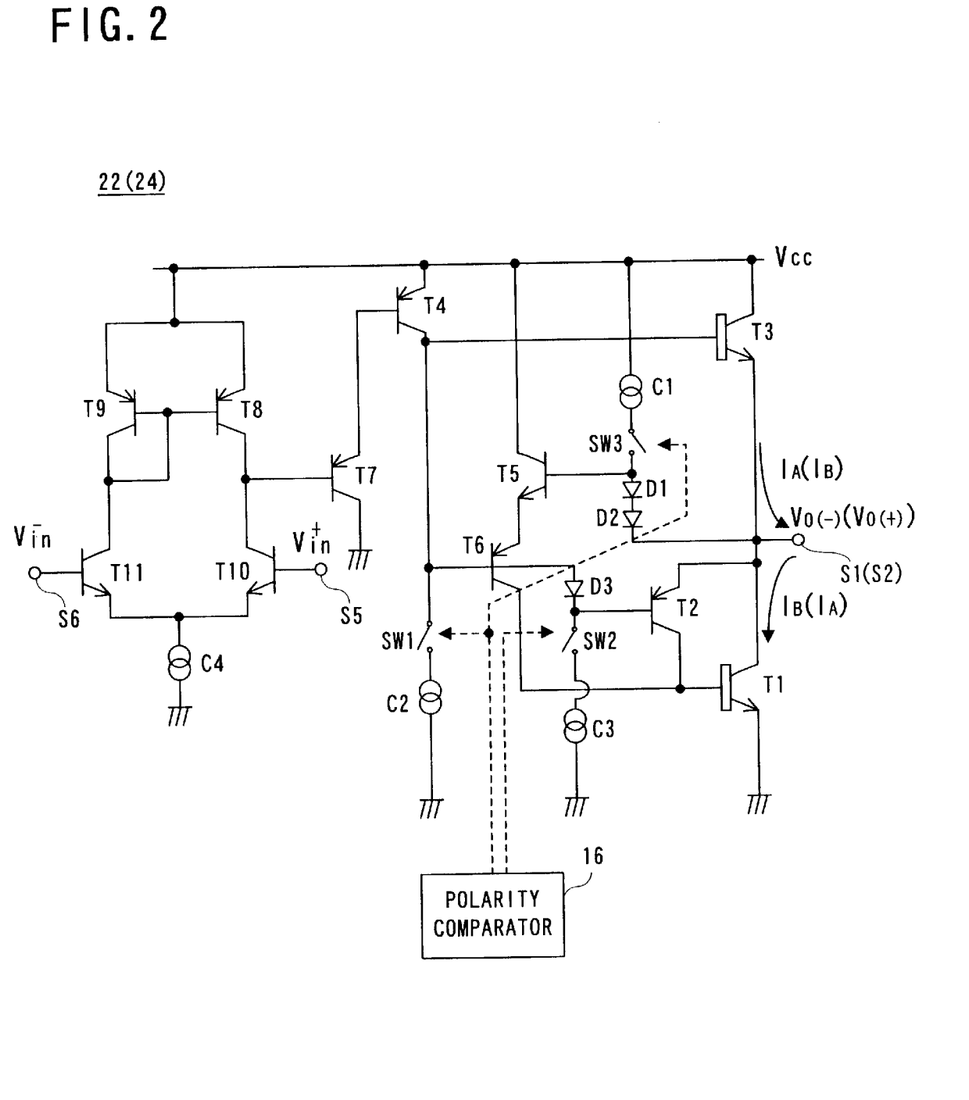
FIG. 2 is a circuit diagram showing a portion of FIG. 1 embodiment.

The operational amplifier 22 is constituted as shown in FIG. 2. More specifically, the plus (+) or positive terminal S5 is connected to a base of a transistor T10, and the minus (−) or a negative terminal S6 is connected to a base of a transistor T11. The transistors T10 and T11 form a differential pair, and respective emitters are connected to the ground through a constant-current source C4. A collector of the transistor T10 is connected to a collector of a transistor T8 whose emitter is connected to a power source $V_{CC}$. On the other hand, a collector of the transistor T11 is connected to a collector of a transistor T9 having an emitter connected to the power source $V_{CC}$. Bases of the transistors T8 and T9 are connected to each other, and a connecting point of the bases is connected to the collector of the transistor T9. That is, the transistors T8 and T9 form a current mirror circuit.

The collector of the transistor T10 is connected to a base of a transistor T7 whose collector is grounded, and an emitter of the transistor T7 is connected to a base of a transistor T4. That is, the transistor T7 is connected to the transistor T4 in a Darlington manner. An emitter of the transistor T4 is connected to the power source $V_{CC}$, and a collector of the transistor T4 is grounded through a switch SW1 and a constant-current source C2. The collector of the transistor T4 is also connected to bases of transistors T3 and T6, and connected to an anode of a diode D3.

A collector of the transistor T3 is connected to the power source $V_{CC}$, an emitter of the transistor T3 is connected to a collector of a transistor T1 and an emitter of a transistor T2, and an emitter of the transistor T1 is grounded. The transistor T2 is a PNP type transistor, and a collector of the transistor T2 is connected to a base of the transistor T1. That is, the transistors T1 and T3 form a push-pull circuit, and the transistors T1 and T2 form an inverted Darlington circuit.

The base of the transistor T6 is grounded through the diode D3, a switch SW2 and a constant-current source C3, and a collector of the transistor T6 is connected to the base of the transistor T1, and an emitter of the transistor T6 is connected to an emitter of the transistor T5. A collector of the transistor T5 is connected to the power source $V_{CC}$, and a base of the transistor T5 is connected to an anode of a diode D1. A connecting point of the transistors T3 and T1 is connected to the power source $V_{CC}$ through the diodes D1 and D2, a switch SW3 and a constant-current source C1, and an output terminal S1 is connected to the connecting point of the transistors T3 and T1.

In addition, since the operational amplifier 24 is constituted in a manner the same or similar to the operational amplifier 22, a duplicate description is omitted here.

Figure 3A:
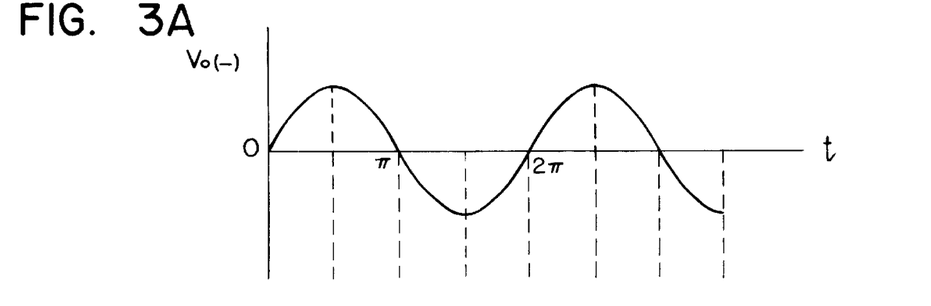
FIGS. 3A–3D are waveform charts showing portions of an operation of FIG. 2 embodiment.
Figure 3B:
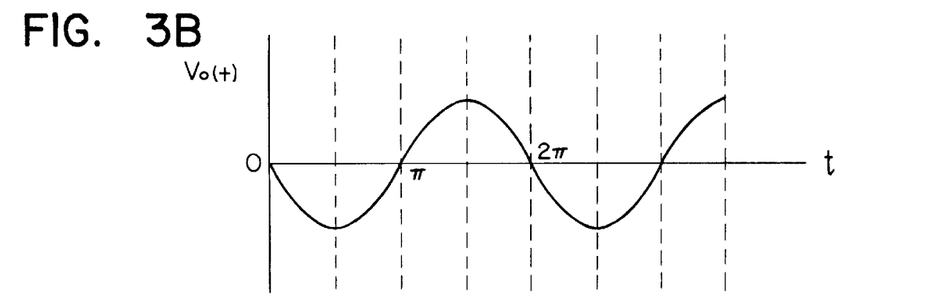
Figure 3C:
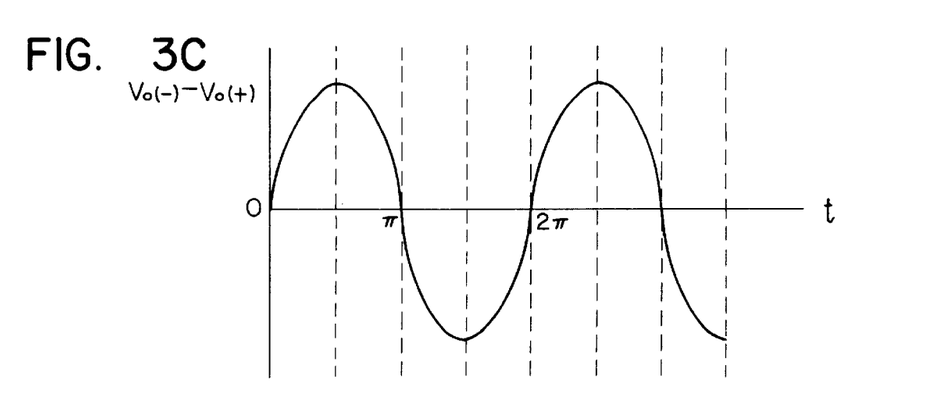
Figure 3D:
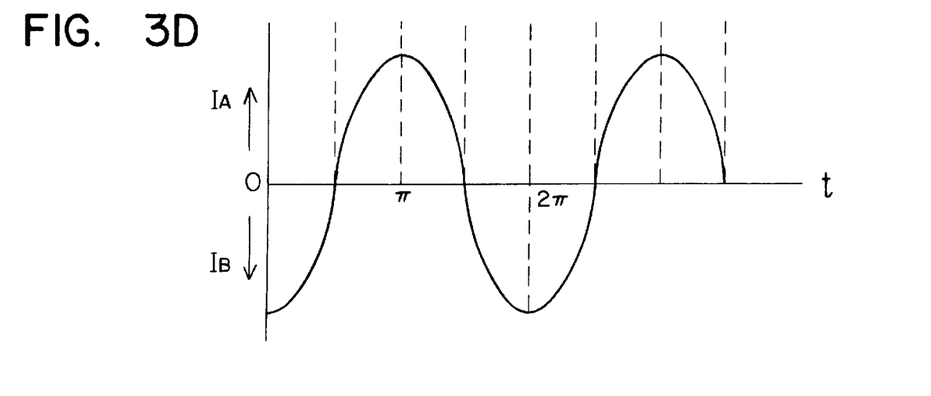

A predetermined DC voltage associated with the reference voltage is applied to the terminal S6, and the amplified AC voltage outputted from the operational amplifier 14 is applied to the terminal S5. Accordingly, a base current of the transistor T7 is changed in response to the amplified AC voltage, whereby a collector voltage having the same phase as the amplified AC voltage appears at the collector of the transistor T4. An emitter voltage of the transistor T3, that is, the drive voltage $V_{O(-)}$ or $V_{O(+)}$ is changed in response to such the collector voltage. Since the drive voltages $V_{O(-)}$ and $V_{O(+)}$ are in a reversed-phase relation as shown in FIG. 3(A) and (B), a terminal voltage of the inductive load L is changed as shown in FIG. 3(C), and an excitation current having a phase delayed by 90 degrees from the terminal voltage flows the inductive load L That is, the excitation current changes as shown in FIG. 3(D) in comparison with the terminal voltage shown in FIG. 3(C). In addition, in FIG. 3(D), a current $I_A$ denotes an excitation current flowing from the terminal S1 to the terminal S2, and a current $I_B$ denotes an excitation current flowing from the terminal S2 to the terminal S1.

Since the input voltage from the terminal S3 and the drive voltage $V_{O(-)}$ are in a reversed-phase relation, the high level signal is outputted from the comparator 18 when the drive voltage $V_{O(-)}$ is the negative polarity. The switch SW2 is turned-off by the high level signal, and the switches SW1 and SW3 are turned-on by a low level signal obtained by inverting the high level signal by the inverter 20. That is, each of the switches SW1 to SW3 is an active-low switch which is turned-on by the low level signal and -off by the high level signal. Accordingly, when the drive voltage $V_{O(-)}$ is negative, a first idling loop constituted by the constant-current source C1, the diodes D1 and D2, and the transistors T5 and T6 is enabled by the polarity comparator 16. In contrast, the low level signal is outputted from the comparator 18 when the drive voltage $V_{O(-)}$ is a positive polarity, and therefore, the switches SW1 and SW3 are turned-off, and the switch SW1 is turned-on. Accordingly, a second idling loop constituted by the transistor T2, the diode D3 and the constant-current source C3 is enabled.

In addition, though the drive voltages $V_{O(-)}$ and $V_{O(+)}$ are in the reversed-phase relation, the output of the comparator 18 is applied to the switches SW1 and SW3, and the output of the inverter 20 is applied to the switch SW2. Accordingly, even in the operational amplifier 24, the first idling loop is formed when the drive voltage $V_{O(+)}$ is the negative polarity, and the second idling loop is formed when the drive voltage $V_{O(+)}$ is the positive polarity. That is, the second idling loop is formed in the operational amplifier 24 when the first idling loop is formed in the operational amplifier 22, and the first idling loop is formed in the operational amplifier 24 when the second idling loop is formed in the operational amplifier 22.

With referring to FIGS. 3A–3D, if the excitation current $I_A$ flows through the inductive load L when the terminal voltage of the inductive load L is a negative polarity, the collector voltage of the transistor T4 becomes slightly higher than the drive voltage $V_{O(-)}$ in the operational amplifier 22. Accordingly, the transistor T3 is turned-on and the transistor T1 is turned-off. Therefore, an emitter current of the transistor T3 is outputted from the terminal S1 as the excitation current $I_A$. In addition, since the transistor T1 is turned-off at this time, a lower limit of a dynamic range of the drive voltage $V_{O(-)}$ may be less than a ground potential.

If the excitation current $I_B$ flows through the inductive load L when the terminal voltage is the negative polarity, the collector voltage of the transistor T4 becomes equal to the drive voltage $V_{O(-)}$ in the operational amplifier 22. Accordingly, the transistors T5 and T6 become conductive states, whereby an emitter current of the transistor T5 is inputted to the base of the transistor T1 which is then turned-on, and therefore, the excitation current $I_B$ flows into the ground through the transistor T1. In addition, at this time, the lower limit of the dynamic range of the drive voltage $V_{O(-)}$ becomes a saturation voltage $V_{SAT(T1)}$ of the transistor T1.

Thus, when the drive voltage $V_{O(-)}$ has the negative polarity, the lower limit of the dynamic range of the drive voltage $V_{O(-)}$ is changed in response to turning-on or -off of the transistor T1.

When the terminal voltage of the inductive load L is the negative polarity, the switch SW2 is turned-off, and thus, a current path including the transistor T2, the switch SW2 and the current-current source C3 is interrupted. Accordingly, the first idling loop can suitably turn-on the transistor T1 even if the drive voltage $V_{O(-)}$ is lowered to the saturation voltage $V_{SAT(T1)}$ of the transistor T1. More specifically, a lower limit of the drive voltage $V_{O(-)}$ that the first idling loop can be suitably operated is the saturation voltage $V_{SAT(T1)}$ of the transistor T1, and the lower limit is coincident with the lower limit of the dynamic range of the drive voltage $V_{O(-)}$ at a time that the excitation current $I_B$ flows, and therefore, the first idling loop is suitably operated. In addition, an upper limit of the drive voltage $V_{O(-)}$ that the first idling loop can be suitably operated is "$V_{CC}-V_{SAT(C1)}-2V_F$".

On the other hand, when the terminal voltage of the inductive load L has a positive polarity, the second idling loop is enabled. When the excitation current $I_A$ flows through the inductive load L, the collector voltage of the transistor T4 becomes slightly higher than the drive voltage $V_{O(-)}$, whereby the transistor T3 is turned-on. Since the second idling loop is provided with the diode D3 having the same forward drop voltage as a voltage between the base and the emitter of the transistor T2, when the transistor T3 is turned-on, the transistor T2 is not turned-on, whereby the transistor T1 keeps an off state In addition, at this time, an upper limit of the dynamic range of the drive voltage $V_{O(-)}$ is "$V_{CC}-V_{BE(T3)}-V_{SAT(T4)}$" ($V_{BE(T3)}$: a base-emitter voltage of the transistor T3, $V_{SAT(T4)}$: a saturation voltage of the transistor T4).

In contrast, when the excitation current $I_B$ flows through the inductive load L, the collector voltage of the transistor T4 becomes equal to the drive voltage $V_{O(-)}$, whereby the Darlinton circuit constituted by the transistors T1 and T2 is operated. That is, the excitation current $I_B$ flows into the ground through the transistor T1. In addition, the transistor T3 becomes the off state at this time, and the upper limit of the dynamic range of the drive voltage $V_{O(-)}$ may be more than "$V_{CC}$".

Since the second idling loop is provided with the transistor T2 connected to the transistor T1 in the Darlington manner with the second idling loop, a lower limit of the drive voltage $V_{O(-)}$ that the second idling loop can be suitably operated is a summation of a voltage between the base and the emitter of the transistor T1 and a saturation voltage $V_{SAT(T2)}$ of the transistor T2, which is higher than the situation voltage $V_{SAT(T1)}$, i.e. the lower limit of the dynamic range of the drive voltage $V_{O(-)}$. On the other hand, an upper limit of the drive voltage $V_{O(-)}$ that the second idling loop can suitably turn-on the transistor T1 is more than "$V_{CC}$", and the upper limit is coincident with the upper limit of the dynamic range of the drive voltage $V_{O(-)}$ at a time that the excitation current $I_B$ flows. Since the second idling loop is enabled when the drive voltage $V_{O(-)}$ has the positive polarity, the second idling loop is suitably operated.

In addition, though the emitter current of the transistor T3 is outputted from the terminal S2 as the excitation current $I_B$, and the excitation current $I_A$ flows into the ground through the transistor T1 in the operational amplifier 24, since an operation of the operational amplifier 24 is similar to the operation of the operational amplifier 22, a duplicate description is omitted here.

According to the above described embodiment, since the first idling loop and the second idling loop are to be selectively enabled in accordance with the polarity of the drive voltages $V_{O(-)}$ and $V_{O(+)}$, the transistor T1 is suitably controlled, and therefore, it is possible to stabilize the negative feedback operations of the negative feedback amplifiers 26 and 28.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. An inductive load drive circuit which supplies a drive voltage having a dynamic range to an inductive load, comprising:

a pulling-in means for pulling-in an excitation current having a predetermined polarity and generated at said inductive load;

a first control means for controlling said pulling-in means on the bases of said drive voltage changing within a first range which is narrower than said dynamic range and whose lower limit is coincident with a lower limit of said dynamic range;

a second control means for controlling said pulling-in means on the basis of said drive voltage changing within a second range which is narrower than said dynamic range and whose upper limit is coincident with an upper limit of said dynamic range; and an enabling means for selectively enabling said first control means and said second control means according to a change of said drive voltage.

2. An inductive load drive circuit according to claim 1, wherein said pulling-in means includes a first transistor, and said excitation current flows through said first transistor when said first transistor is turned-on by one of said first control means and said second control means.

3. An inductive load drive circuit according to claim 2, wherein said second control means includes a second transistor connected to said first transistor in a Darlington manner, a current input means for inputting a base current to said second transistor, and a switching means inserted between a base of said second transistor and said current input means.

4. An inductive load drive circuit according to claim 3, wherein said enabling means includes a change detection means for detecting the change of said drive voltage, and a switching control means for turning-on or -off said switching means according to an output of said change detection means.

5. An inductive load drive circuit according to claim 4, wherein said change detection means includes a comparison means for comparing a first associated voltage associated with said drive voltage and a reference voltage.

6. An inductive load drive circuit according to claim 3, wherein said second control means includes a voltage dropping means inserted between a voltage point having a second associated voltage associated with said drive voltage and the base of said second transistor.

7. An inductive load drive circuit according to claim 6, wherein said second transistor is a PNP type transistor having an emitter connected to an output terminal of said drive voltage and a collector connected to a base of said first transistor, and a drop voltage of said voltage dropping means is equal to a voltage between the base and the emitter of said second transistor.

* * * * *